(12) United States Patent
Osaki

(10) Patent No.: US 9,192,045 B2
(45) Date of Patent: Nov. 17, 2015

(54) PRINTED WIRING BOARD AND METHOD FOR MANUFACTURING PRINTED WIRING BOARD

(71) Applicant: IBIDEN CO., LTD., Ogaki (JP)

(72) Inventor: Atsushi Osaki, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/291,048

(22) Filed: May 30, 2014

(65) Prior Publication Data

US 2014/0353027 A1 Dec. 4, 2014

(30) Foreign Application Priority Data

May 31, 2013 (JP) ................................. 2013-114865

(51) Int. Cl.
| | |
|---|---|
| *H05K 1/02* | (2006.01) |
| *H05K 1/11* | (2006.01) |
| *H05K 3/00* | (2006.01) |
| *H05K 3/42* | (2006.01) |
| *H05K 3/46* | (2006.01) |

(52) U.S. Cl.
CPC .............. *H05K 1/115* (2013.01); *H05K 1/0251* (2013.01); *H05K 3/0038* (2013.01); *H05K 3/427* (2013.01); *H05K 3/4661* (2013.01); *H05K 2201/09854* (2013.01); *H05K 2203/1476* (2013.01); *H05K 2203/1572* (2013.01); *Y10T 29/49165* (2015.01)

(58) Field of Classification Search
CPC ..... H05K 1/0251; H05K 1/112; H05K 1/113; H05K 1/114; H05K 1/115; H05K 1/116
See application file for complete search history.

(56) References Cited

FOREIGN PATENT DOCUMENTS

JP 2006-041463 2/2006

*Primary Examiner* — Jeremy C Norris
(74) *Attorney, Agent, or Firm* — Oblon, McClelland, Maier & Neustadt, L.L.P.

(57) ABSTRACT

A printed wiring board includes an insulative substrate having a penetrating hole, a first conductive layer formed on a first surface of the insulative substrate, a second conductive layer formed on a second surface of the insulative substrate, and a through-hole conductor formed in the penetrating hole through the insulative substrate such that the through-hole conductor is connecting the first conductive layer and second conductive layer. The penetrating hole has a first opening portion formed on a first-surface side of the insulative substrate and a second opening portion formed on a second-surface side of the insulative substrate such that the second opening portion has a depth which is greater than a depth of the first opening portion and the second opening portion has a volume which is greater than a volume of the first opening portion, and the through-hole conductor formed in the second opening portion includes a void portion.

20 Claims, 14 Drawing Sheets

(A)

(B)

(C)

(A)

(B)

(A)

(B)

(A)

(B)

(A)

(B)

(A)

(B)

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2013-114865, filed May 31, 2013, the entire contents of which are incorporated herein by reference.

BACKGROUND OF THE INVENTION

1. Field of the Invention

The present invention relates to a printed wiring board having a through-hole conductor shaped like an hourglass, and to a method for manufacturing such a printed wiring board.

2. Description of Background Art

JP 2006-41463A describes forming in an insulative substrate an hourglass-shaped penetrating hole made up of a first blind hole and a second blind hole, and filling the penetrating hole with plating. The entire contents of this publication are incorporated herein by reference.

SUMMARY OF THE INVENTION

According to one aspect of the present invention, a printed wiring board includes an insulative substrate having a penetrating hole, a first conductive layer formed on a first surface of the insulative substrate, a second conductive layer formed on a second surface of the insulative substrate, and a through-hole conductor formed in the penetrating hole through the insulative substrate such that the through-hole conductor is connecting the first conductive layer and the second conductive layer. The penetrating hole has a first opening portion formed on a first-surface side of the insulative substrate and a second opening portion formed on a second-surface side of the insulative substrate such that the second opening portion has a depth which is greater than a depth of the first opening portion and the second opening portion has a volume which is greater than a volume of the first opening portion, and the through-hole conductor formed in the second opening portion includes a void portion.

According to another aspect of the present invention, a method for manufacturing a printed wiring board includes irradiating laser on a first surface of an insulative substrate such that a first opening portion is formed on a first-surface side of the insulative substrate, irradiating laser on a second surface of the insulative substrate such that a second opening portion connected to the first opening portion is formed on a second-surface side of the insulative substrate and a penetrating hole for a through-hole conductor is formed through the insulative substrate, forming a seed layer in the penetrating hole and on the first surface and the second surface of the insulative substrate, and filling an electrolytic plated material into a space formed by the seed layer in the penetrating hole of the insulative substrate such that a through-hole conductor including the electrolytic plated material is formed in the penetrating hole. The second opening portion is formed such that the second opening portion has a volume which is greater than a volume of the first opening portion, and the through-hole conductor is formed such that the through-hole conductor formed in the second opening portion includes a void portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
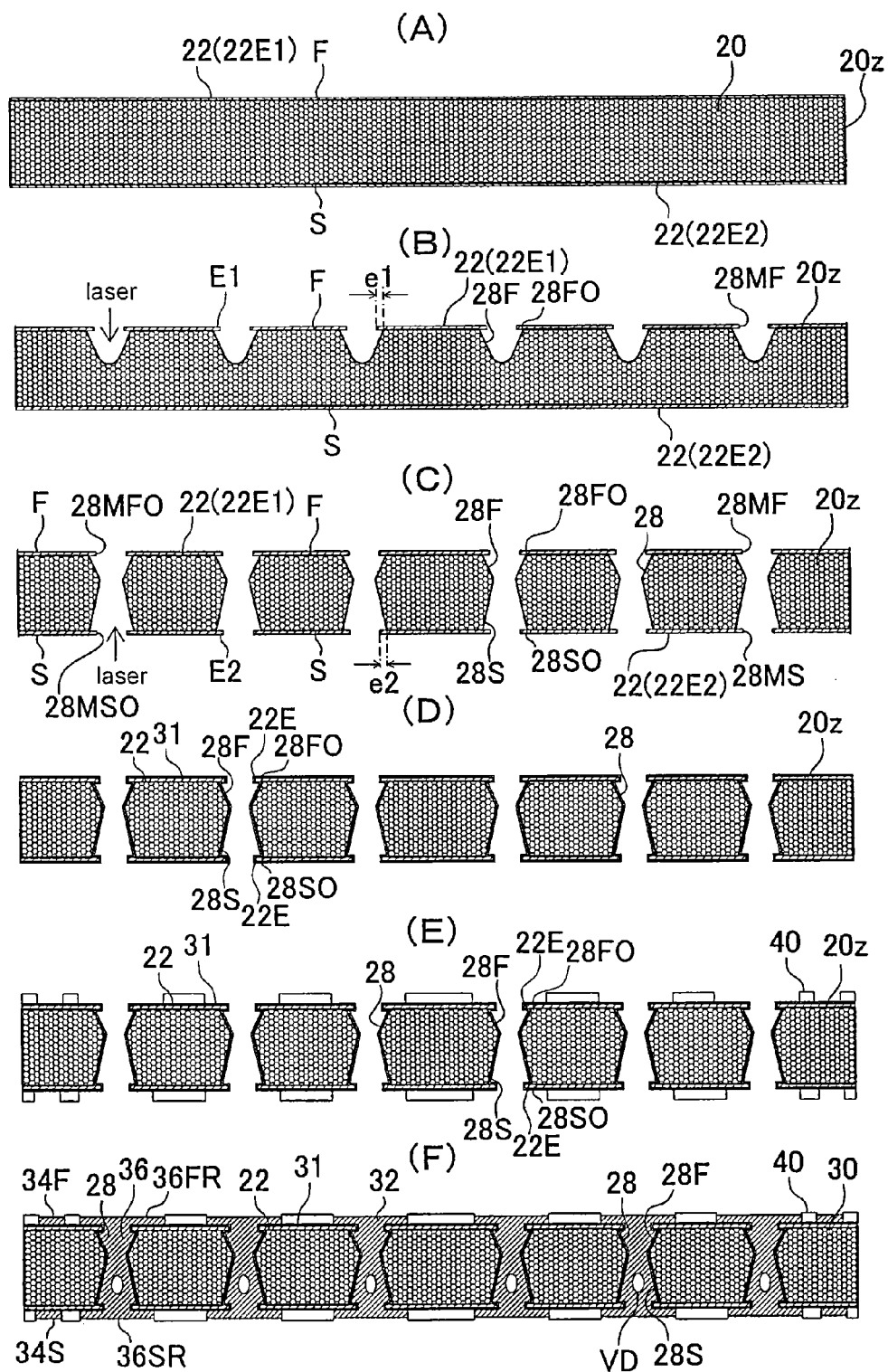
FIGS. 1(A)-(F) show views of processing steps in a method for manufacturing a printed wiring board according to a first embodiment of the present invention.
Figure 2:
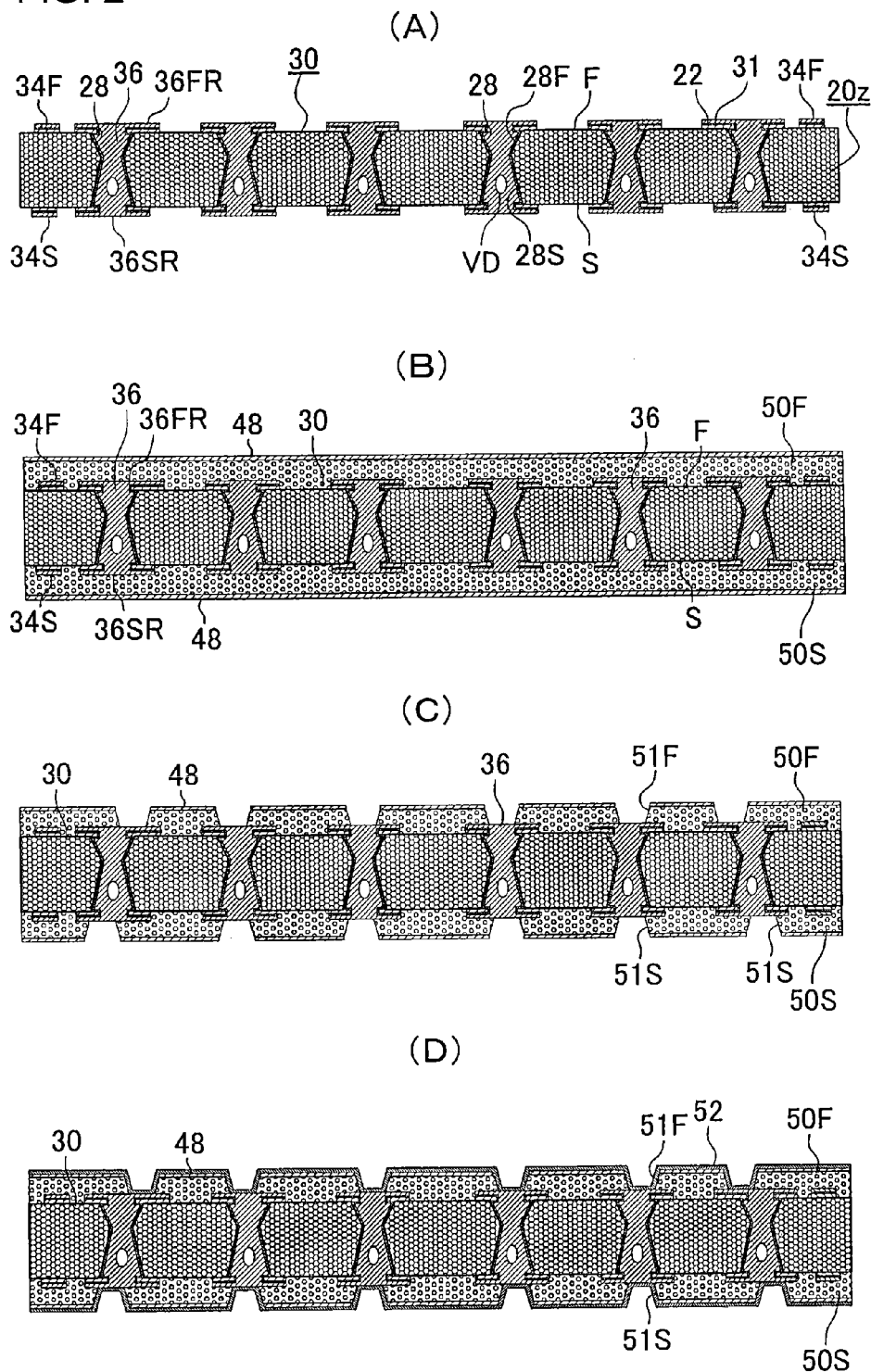
FIGS. 2(A)-(D) show views of processing steps in the method for manufacturing a printed wiring board according to the first embodiment.
Figure 3:
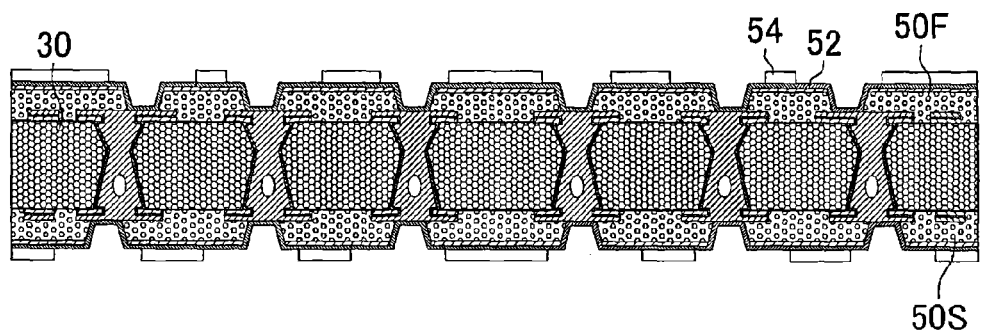
FIGS. 3(A)-(C) show views of processing steps in the method for manufacturing a printed wiring board according to the first embodiment.
Figure 3:
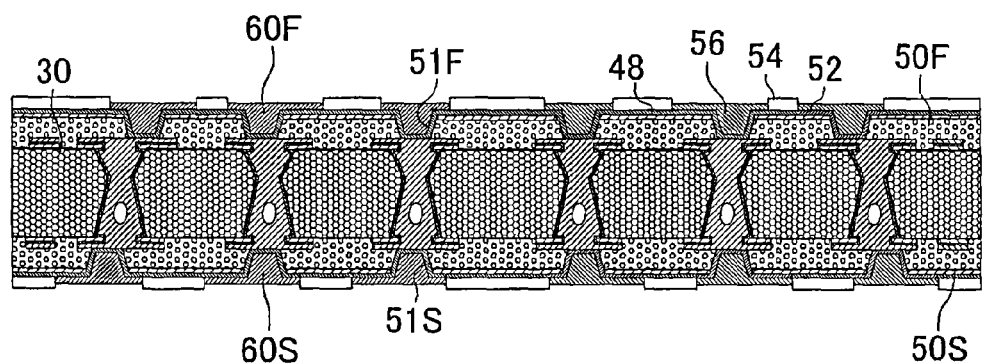
Figure 3:
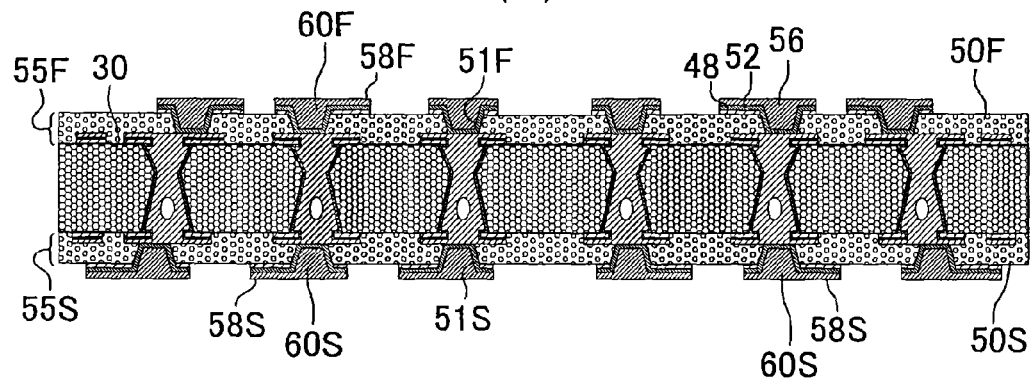
Figure 4:
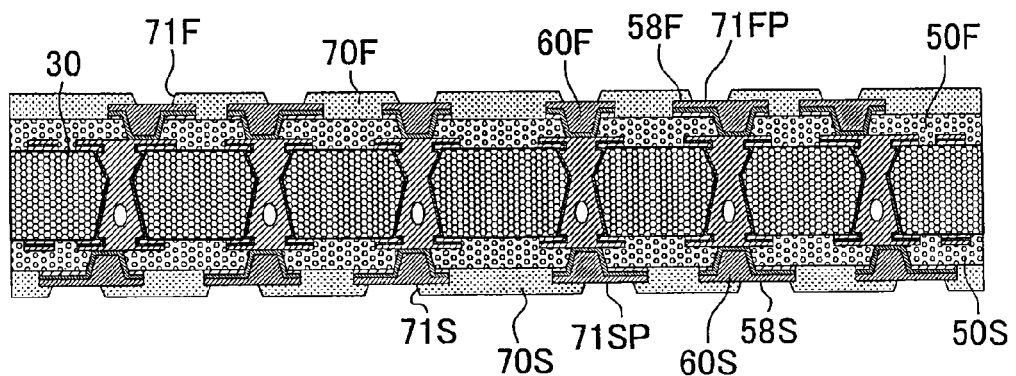
FIGS. 4(A)-(B) show views of processing steps in the method for manufacturing a printed wiring board according to the first embodiment.
Figure 4:
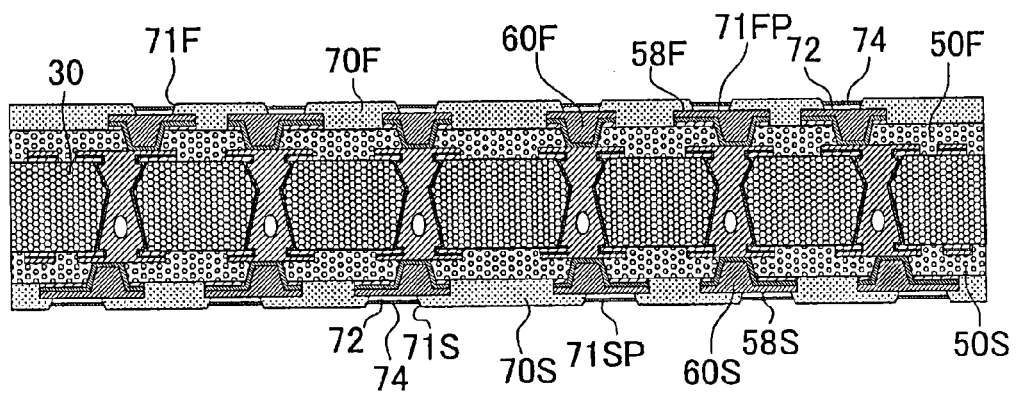

The embodiments will now be described with reference to the accompanying drawings, wherein like reference numerals designate corresponding or identical elements throughout the various drawings.

First Embodiment

Figure 5:
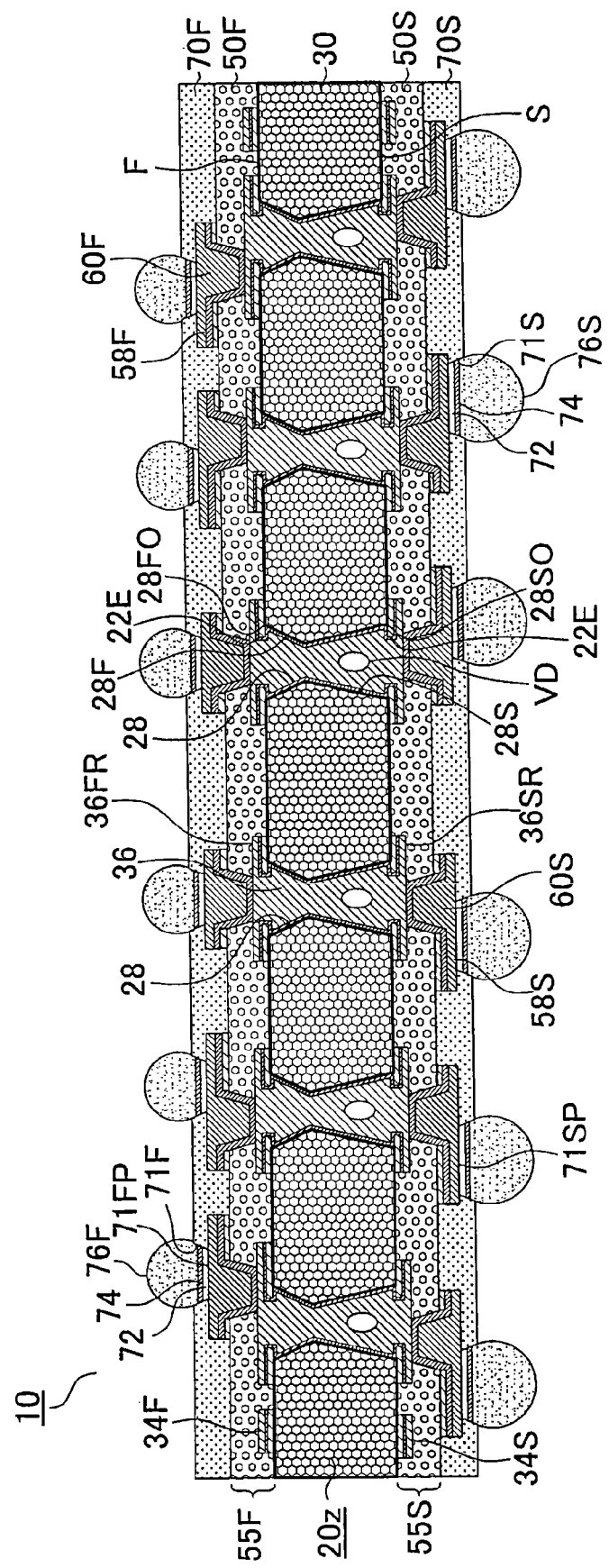
FIG. 5 is a cross-sectional view of a printed wiring board according to the first embodiment.

FIG. 5 shows a buildup wiring board according to a first embodiment of the present invention.

Buildup wiring board 10 of the first embodiment has a printed wiring board 30 and buildup layers formed on the printed wiring board. Printed wiring board 30 has insulative substrate (20z) that has first surface (F) and second surface (S) opposite the first surface along with penetrating hole 28 for a through-hole conductor; first conductive layer (34F) formed on first surface (F) of the insulative substrate; and second conductive layer (34S) formed on second surface (S) of the insulative substrate. Penetrating hole 28 is made up of first opening portion (28F) formed on the first-surface side and second opening portion (28S) formed on the second-surface side of the insulative substrate. First conductive layer (34F) includes through-hole land (first through-hole land) (36FR), and second conductive layer (34S) includes through-hole land (second through-hole land) (36SR). The first and second conductive layers also include multiple conductive circuits. The printed wiring board further includes through-hole conductor 36 formed in penetrating hole 28 for a through-hole conductor. Through-hole conductor 36 connects first conductive layer (34F) and second conductive layer (34S). The first surface of the printed wiring board corresponds to the first surface of the insulative substrate and the second surface of the printed wiring board corresponds to the second surface of the insulative substrate.

When the starting material for the printed wiring board is a double-sided copper-clad laminate, for example, a first metal foil is laminated on the first surface of the insulative substrate and a second metal foil is laminated on the second surface of the insulative substrate. Copper foil is preferred as the metal foil.

Interlayer resin insulation layer (uppermost interlayer resin insulation layer) (50F) is formed on first surface (F) of printed wiring board 30. Conductive layer (uppermost conductive layer) (58F) is formed on interlayer resin insulation layer (50F). Conductive layer (58F) is connected to first conductive layer (34F) or a though-hole conductor by via conductor (uppermost via conductor) (60F) penetrating through interlayer resin insulation layer (50F). Upper buildup layer (55F) is made up of interlayer resin insulation layer (50F), conductive layer (58F) and via conductor (60F). In the first embodiment, the upper buildup layer is single-layered.

Interlayer resin insulation layer (lowermost interlayer resin insulation layer) (50S) is formed on second surface (S) of printed wiring board 30. Conductive layer (lowermost conductive layer) (58S) is formed on interlayer resin insulation layer (50S). Conductive layer (58S) is connected to second conductive layer (34S) or a though-hole conductor by via conductor (lowermost via conductor) (60S) penetrating through interlayer resin insulation layer (50S). Lower buildup layer (55S) is made up of interlayer resin insulation layer (50S), conductive layer (58S) and via conductor (60S). In the first embodiment, the lower buildup layer is single-layered.

Upper solder-resist layer (70F) is formed on the upper buildup layer, and lower solder-resist layer (70S) is formed on the lower buildup layer. Solder-resist layer (70F) has opening (71F) that exposes the top surface of conductive layer (58F) or via conductor (60F). Solder-resist layer (70S) has opening (71S) that exposes the top surface of conductive layer (58S) or via conductor (60S).

The portion exposed from opening (71F) of upper solder-resist layer (70F) works as C4 pad (71FP). Solder bump (C4 bump) (76F) is formed on pad (71FP). The portion exposed from opening (71S) of lower solder-resist layer (70S) works as BGA pad (71SP). Solder bump (BGA bump) (76S) is formed on BGA pad (71SP).

Figure 7:
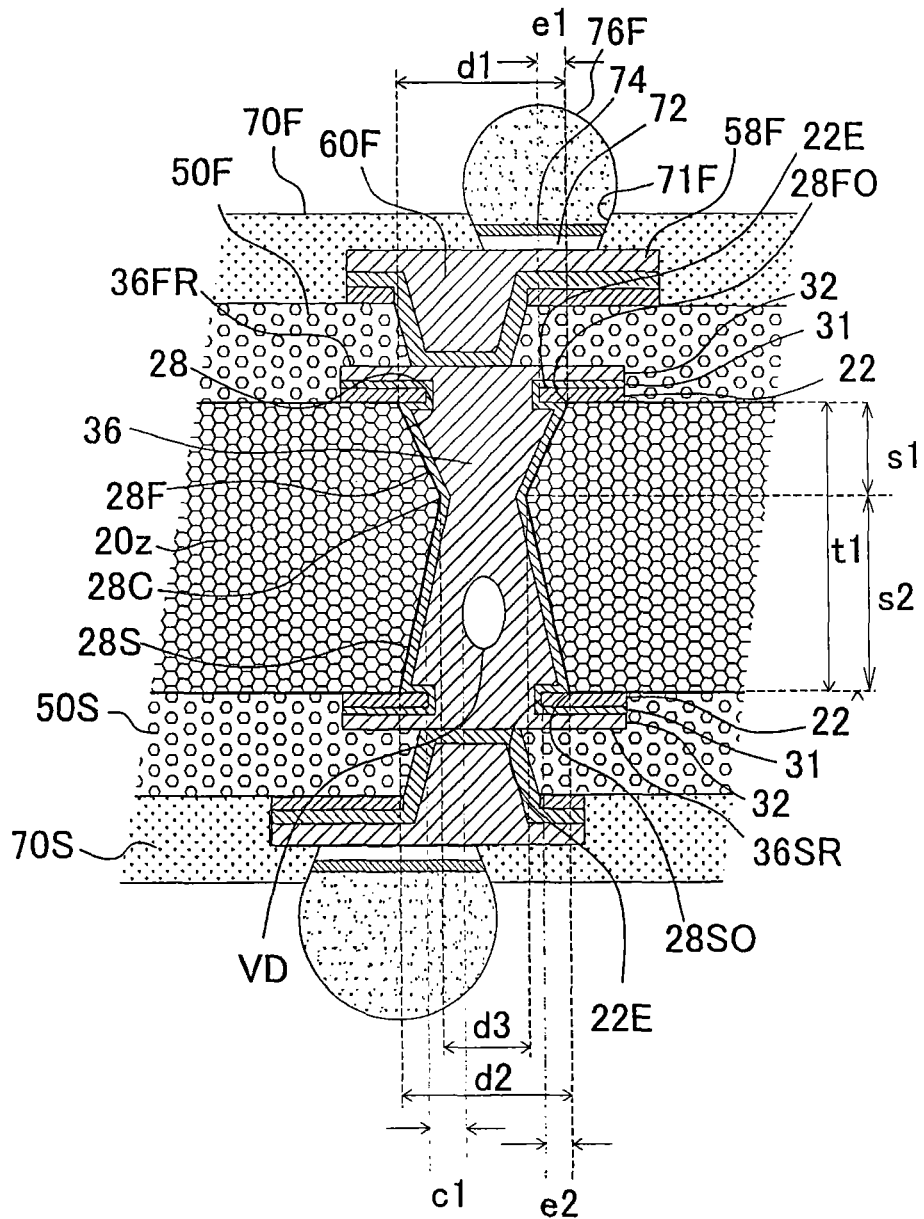
FIG. 7 is an enlarged cross-sectional view showing part of the printed wiring board in FIG. 5.

FIG. 7 is an enlarged view showing part of a buildup wiring board of the first embodiment.

Hourglass-shaped penetrating hole 28 is made up of first opening portion (28F) having first opening (28FO) on first surface (F) and second opening portion (28S) having second opening (28SO) on second surface (S). First opening portion (28F) tapers from the first surface toward the second surface while second opening portion (28S) tapers from the second surface toward the first surface. First opening portion (28F) and second opening portion (28S) are connected at connecting portion (28C) in the insulative substrate. The first opening portion and the second opening portion are formed in the insulative substrate, and the volume of second opening portion (28S) is greater than the volume of first opening portion (28F).

Figure 14:
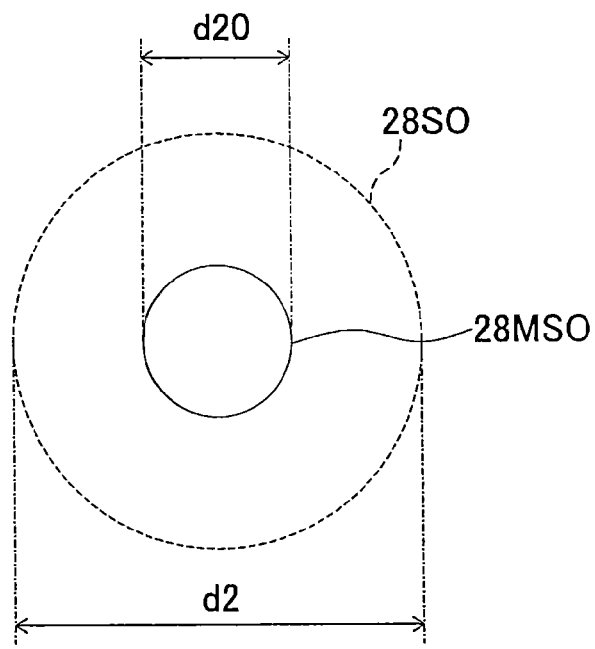
FIGS. 14(A)-(B) show plan views of an opening in metal foil and an opening in an opening portion.
Figure 14:
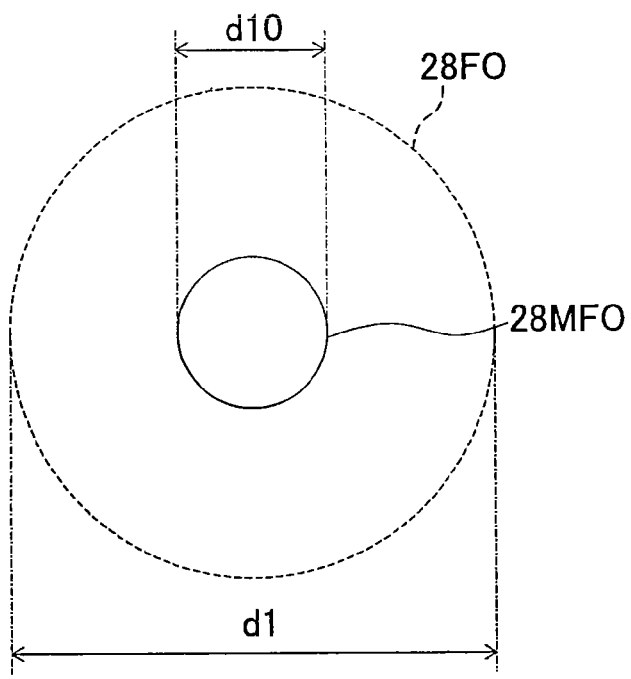

First opening (28FO) is formed on the interface of the first surface of the insulative substrate and the first conductive layer, and second opening (28SO) is formed on the interface of the second surface of the insulative substrate and the second conductive layer. FIG. 14(A) shows the second surface of the insulative substrate, and the dotted line indicates the periphery of second opening (28SO). FIG. 14(B) shows the first surface of the insulative substrate, and the dotted line indicates the periphery of first opening (28FO).

Figure 10:
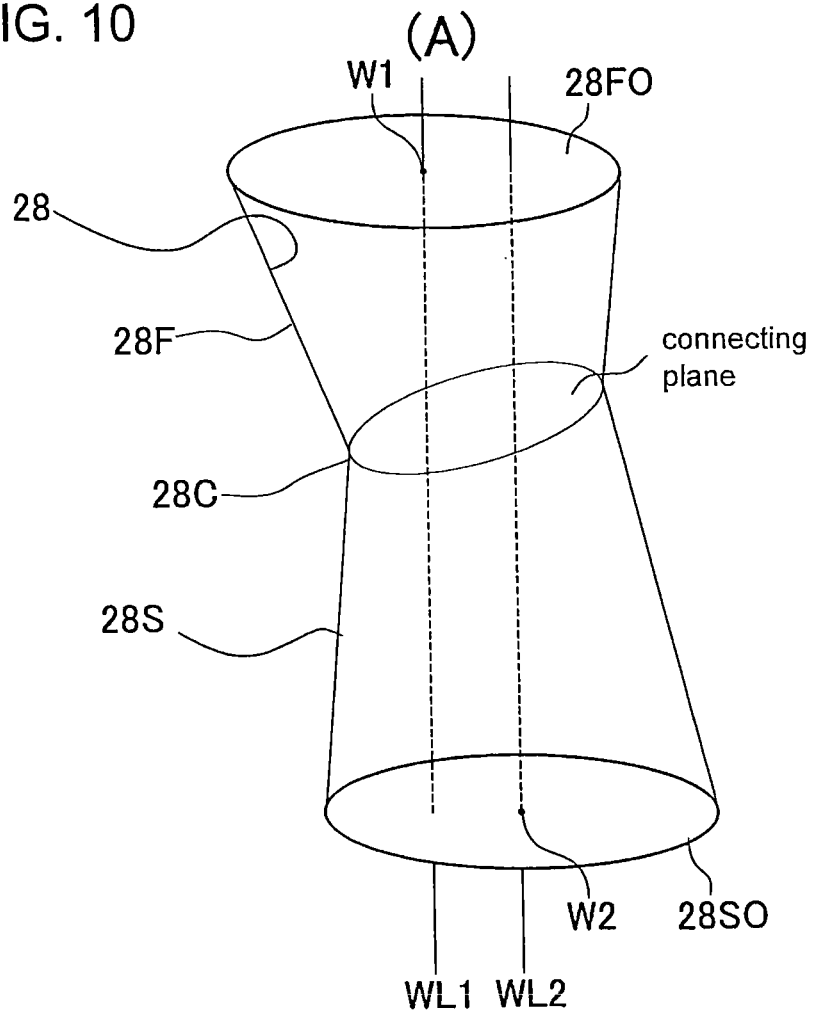
FIGS. 10(A)-(B) schematically show a penetrating hole for a through-hole conductor.
Figure 10:
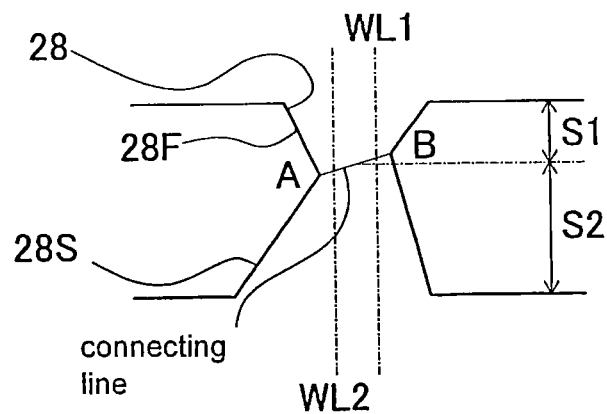
Figure 13:
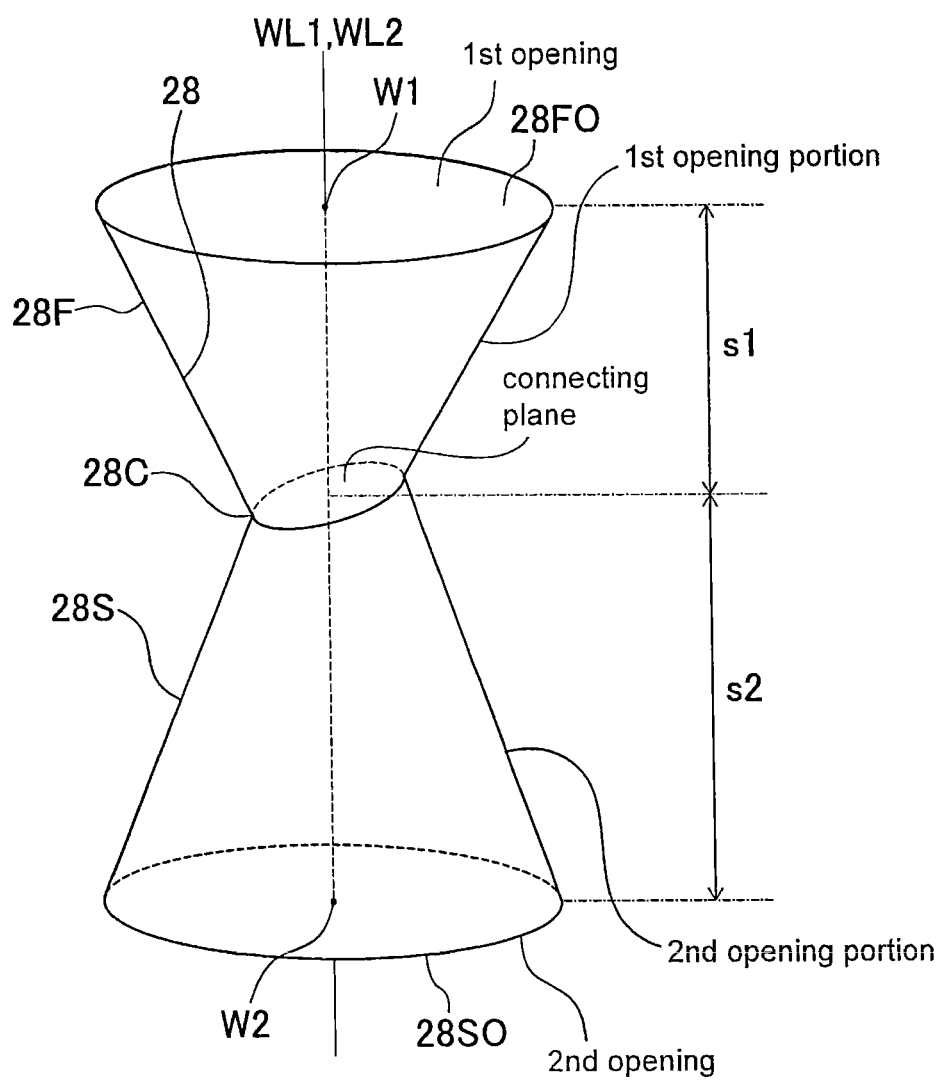
FIG. 13 schematically shows a penetrating hole for a through-hole conductor.

The first opening portion has straight line (WL1) which passes through gravity center (W1) of first opening (28FO) and is perpendicular to the first surface of the insulative substrate (the axis of the first opening portion), and the second opening portion has straight line (WL2) which passes through gravity center (W2) of second opening (28SO) and is perpendicular to the second surface of the insulative substrate (the axis of the second opening portion) (see FIGS. 10 and 13).

Thickness (t1) of insulative substrate (20z) is 10 μm to 400 μm. The ratio of depth (s1) of first opening portion (28F) and depth (s2) of second opening portion (28S) (depth (s2) of second opening portion (28S)/depth (s1) of first opening portion (28F)) is 1.1 to 2. Fine conductive circuits can be formed on the insulative substrate, and the degree of warping of the printed wiring board is reduced. The impact of a void in the through-hole conductor formed in the second opening portion is reduced.

FIG. 7 is a view obtained by cutting a buildup wiring board with a plane that includes a straight line passing through the gravity center of first opening (28FO) and perpendicular to the first surface of the insulative substrate (axis of the first opening portion). In addition, the axis of the first opening portion corresponds to the axis of the second opening portion in FIG. 7. Thus, the connecting plane is substantially parallel to the first surface of the insulative substrate. The connecting plane is a region surrounded by connecting portion (28C). Thus, in FIG. 7, the depth of the first opening portion is the distance between the gravity center of the first opening and the connecting plane, and the depth of the second opening portion is the distance between the gravity center of the second opening and the connecting plane.

In the insulative substrate shown in FIG. 7, thickness (t1) is 200 μm, depth (s1) of first opening portion (28F) is 80 μm, and depth (s2) of second opening portion (28S) is 120 μm. Diameter (d1) of first opening (28FO) of first opening portion (28F) is 100 μm, and diameter (d2) of second opening (28SO) of second opening portion (28S) is 100 μm to 200 μm, and diameter (d3) of the connecting plane is 60 μm. Second opening portion (28S) is formed to have a greater volume than that of the first opening portion.

The cross-sectional shape of penetrating hole 28 is bent at connecting portion (28C). To increase the volume of the second opening portion from the volume of the first opening portion, the ratio of the diameter of the second opening to the diameter of the first opening (diameter of second opening/diameter of first opening) is preferred to be set at 1.2 to 2.

FIG. 10 schematically shows another example of a penetrating hole of the printed wiring board. In FIG. 10, axis (WL1) of a first opening portion is set off from axis (WL2) of a second opening portion. FIG. 10(B) is a view obtained by cutting the insulative substrate by a plane that includes the axis of the first opening portion and the axis of the second opening portion. Since the axis of the first opening portion is set off from the axis of the second opening portion, the connecting plane inclines to the first surface of the insulative substrate. Referring to an example in FIG. 10(A), depth (s1) of first opening portion (28F) is the distance between the center point of the connecting line and the first opening. Also, depth (s2) of second opening portion (28S) is the distance between the center point of the connecting line and the second opening. Here, the center point of the connecting line is the center point of line (AB) shown in FIG. 10(B). Point (A) and point (B) are each a point where a cross section of the first opening portion and a cross section of the second opening portion intersect, as shown in FIG. 10(B).

When the starting material is a copper-clad laminate, penetrating hole 28 is formed with a penetrating hole that penetrates through the insulative substrate and with penetrating holes (28MF, 28MS) that penetrate through the metal foils respectively. Namely, penetrating hole 28 is made up of penetrating hole (28MF) (opening portion of the first metal foil) formed in the first metal foil, first opening portion (28F) formed on the first-surface side of the insulative substrate, second opening portion (28S) formed on the second-surface side of the insulative substrate, and penetrating hole (28MS) (opening portion of the second metal foil) formed in the second metal foil. Penetrating hole (28MF) formed in the first metal foil has opening (28MFO) of the first metal foil (first opening of the first metal foil) on the interface of the first metal foil and the insulative substrate. Penetrating hole (28MS) formed in the second metal foil has opening (28MSO) of the second metal foil (second opening of the second metal foil) on the interface of the second metal foil and the insulative substrate. The periphery of opening (28MFO) and the periphery of opening (28MSO) are shown by a solid line in FIG. 14(A) and 14(B).

As shown in FIG. 14(B), diameter (d10) of first opening (28MFO) of the first metal foil is smaller than diameter (d1) of first opening (28FO) of the first opening portion, and first opening (28MFO) of the first metal foil is included in first opening (28FO) of the first opening portion. First opening (28MFO) of the first metal foil is formed inside first opening (28FO) of the first opening portion. First metal foil 22 (22E1) partially covers the first opening of the first opening portion. The first surface of the insulative substrate is not exposed by first opening (28MFO) of the first metal foil. First metal foil 22 (22E 1) is present over the first opening of the first opening portion. Length (e1) (see FIG. 1(B) of first metal foil (22E1) formed on the first opening of the first opening portion is 0.1 µm to 10 µm.

Figure 8:
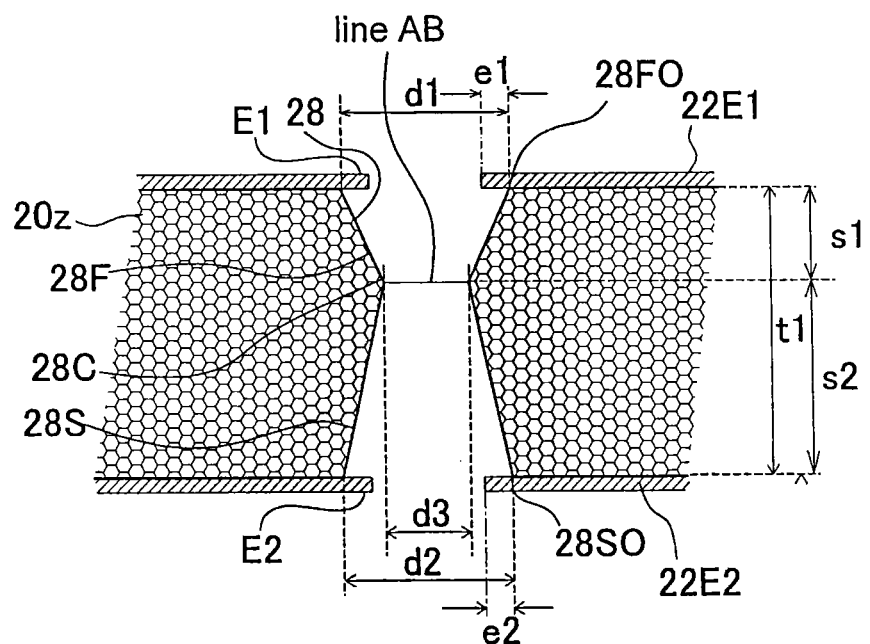
FIGS. 8(A)-(B) show views of processing steps in the method for manufacturing a printed wiring board according to the first embodiment.
Figure 8:
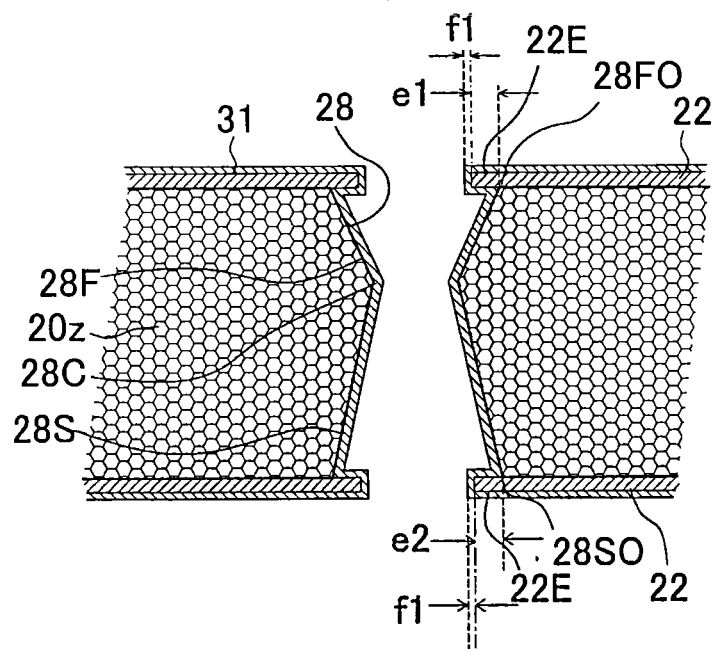

As shown in FIG. 14(A), diameter (d20) of second opening (28MSO) of the second metal foil is smaller than diameter (d2) of second opening (28SO) of the second opening portion, and second opening (28MSO) of the second metal foil is included in second opening (28SO) of the second opening portion. Second opening (28MSO) of the second metal foil is formed inside second opening (28SO) of the second opening portion. Second metal foil 22 (22E2) partially covers the second opening of the second opening portion. The second surface of the insulative substrate is not exposed by second opening (28MSO) of the second metal foil. Second metal foil 22 (22E2) is present over the second opening of the second opening portion. Length (e2) (see FIG. 1(C)) of second metal foil (22E2) formed over the second opening of the second opening portion is 1 µm to 10 µm. In the present application, the metal foils formed over first opening (28FO) and second opening (28SO) are referred to as eaves (E1, E2) respectively. Eaves (E1, E2) are shown in FIG. 8(A) and others. Eave (E1) is formed with the first metal foil, and eave (E2) is formed with the second metal foil.

FIG. 7 shows lands (through-hole lands) (36FR, 36SR) of a through-hole conductor. A through-hole land is made up of a conductor formed around the through-hole conductor (the conductor formed on the first or second surface of the insulative substrate) and of a conductor formed directly on the through-hole conductor. As shown in FIG. 7, through-hole lands (36FR, 36SR) include metal foil (copper foil) 22, electroless plated film 31 and electrolytic plated film 32. First metal foil (copper foil) (22E1) of first through-hole land (36FR) formed on the first surface of the insulative substrate extends over first opening (28FO) of first opening portion (28F). Length (e1) of the extended portion is 0.1 µm to 10 µm. In the same manner, second metal foil (copper foil) (22E2) of second through-hole land (36SR) formed on the second surface of the insulative substrate extends over second opening (28SO) of second opening portion (28S). Length (e2) of the extended portion is 1 µm to 10 µm.

Through-hole conductor 36 is made of electroless plated film 31 formed on the sidewall of penetrating hole 28 and electrolytic plated film 32 formed on the electroless plated film 31. Electrolytic plated film 32 in second opening portion (28S) includes void (VD). Electrolytic plated film 32 in first opening portion (28F) does not include a void. The through-hole conductor formed in the second opening portion includes a void while there is no void formed in the first opening portion. The second opening portion can be filled with electrolytic plated film 32. The length of eave (E1) over the first opening is preferred to be shorter than the length of eave (E2) over the second opening. Plating is filled in the first opening.

In the printed wiring board of the first embodiment, the depth of the first opening portion is less than the depth of the second opening portion. Thus, it is easier to fill plating in the first opening portion while it is harder to fill plating in the second opening portion. Therefore, a void is present in the through-hole conductor formed in the second opening portion in the printed wiring board of the first embodiment. However, since the volume of the second opening portion is greater than the volume of the first opening portion, even if the through-hole conductor in the second opening portion includes a void, the impact of the void is small. For example, the through-hole conductor in the second opening portion will be thinner, but line disconnection is less likely to occur in the through-hole conductor. Resistance increases in the through-hole conductor in the second opening portion, but malfunctions are less likely to occur in the IC chip mounted on the printed wiring board.

If a void is included in the through-hole conductor of the first opening portion with a smaller volume, problems such as line disconnection and malfunctions tend to occur. However, in the first embodiment, the volume of the first opening portion is made smaller by reducing the depth of the first opening portion. Because the distance is short from the first surface of the insulative substrate to the bottom of the first opening portion, the plating solution is fully supplied to the bottom of the first opening portion. Thus, it is easier to fill plated film in the first opening portion of the present embodiment. The through-hole conductor of the present embodiment includes a void in the second opening portion. However, since the depth of the second opening portion is greater than the depth of the first opening portion, and the volume of the second opening portion is greater than the volume of the first opening portion, the reliability of the through-hole conductor of the present embodiment is unlikely to decrease. In addition, when the through-hole conductor of the present embodiment is used as a passage for high current, problems are unlikely to occur.

When the first and second opening portions of the present embodiment are filled with plating, the first opening portion is first filled with plating. At that time, since the second opening portion has a greater volume, the second opening portion is not yet filled with plating. Thus, the plating process is continued until the second opening portion is filled with plating. During that time, plated film is formed on the first surface of the insulative substrate. Simultaneously, plated film is formed on the second surface of the insulative substrate and in the second opening portion. Thus, the thickness of the plated film on the first surface of the insulative substrate is greater than the thickness of the plated film on the second surface of the insulative substrate. When the thickness of the plated film differs on the upper and lower surfaces of the insulative substrate, the printed wiring board tends to warp. In addition, it is hard to form fine conductive circuits on the first surface of the insulative substrate. However, in the present embodiment, a void is formed in the through-hole conductor of the second opening portion. Accordingly, the opening of the first opening portion and the opening of the second opening portion are closed with plated film at substantially the same time. Thus, the thickness of the plated film on the first surface of the insulative substrate is substantially the same as the thickness of the plated film on the second surface of the insulative substrate. The degree of warping of the printed wiring board is reduced. Accordingly, even if a through-hole conductor includes a void, the reliability of the through-hole conductor is high. In addition, fine conductive circuits are formed on the first and second surfaces of the insulative substrate.

When the printed wiring board of the present embodiment has eaves, circulation of the plating solution in a penetrating hole is inhibited. Thus, void (VD) is likely to be formed in second opening portion (28S) with a greater volume. The through-hole land on the second surface of the insulative substrate is preferred to have an eave (eave over the second surface of the insulative substrate), while the through-hole land on the first surface of the insulative substrate is preferred not to have an eave (eave over the first surface of the insulative substrate). Alternatively, the length of the eave of the through-hole land on the second surface of the insulative substrate is preferred to be greater than the length of the eave of the through-hole land on the first surface of the insulative substrate. The through-hole conductor in the second opening portion includes a void, and the through-hole conductor in the first opening portion does not include a void.

Figure 6:
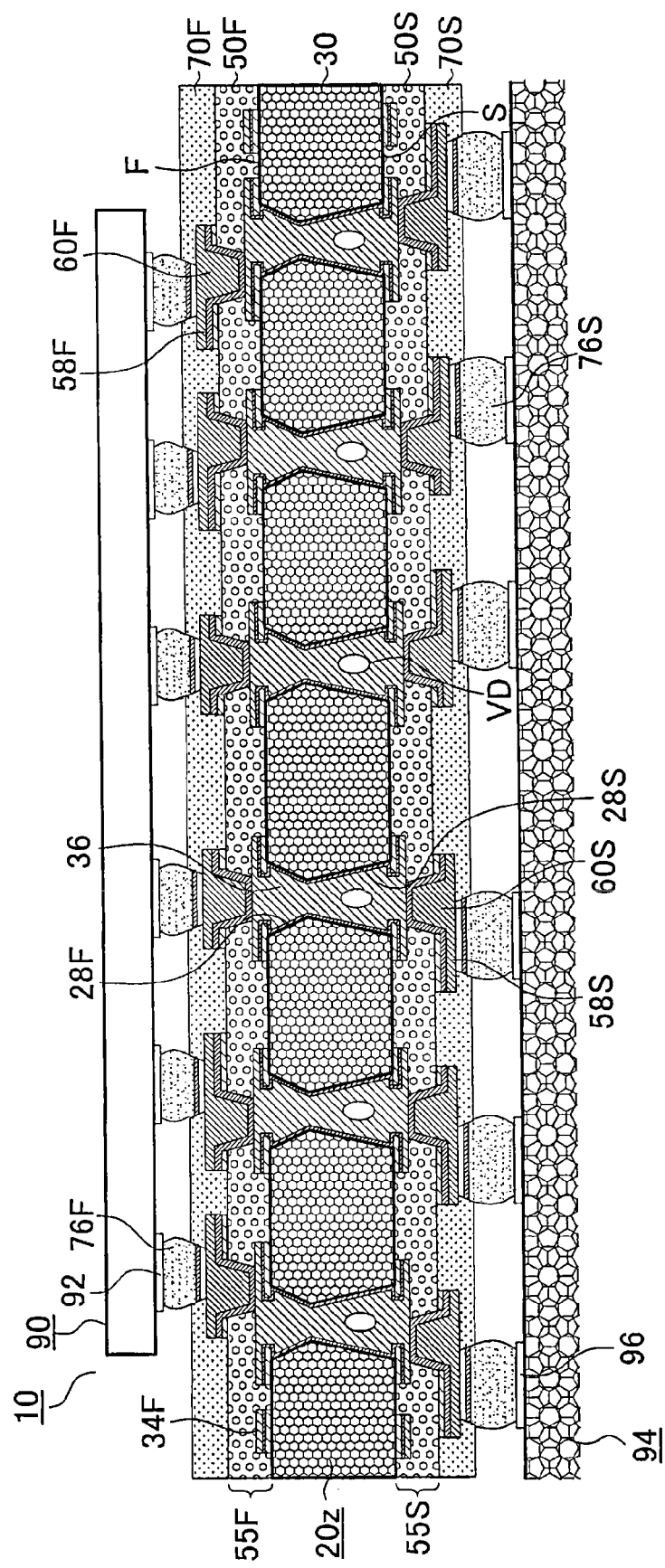
FIG. 6 is a cross-sectional view showing an application example of a printed wiring board of the first embodiment.

FIG. 6 is an application example of the buildup wiring board shown in FIG. 5. In FIG. 6, IC chip 90 is mounted on the buildup wiring board, and the buildup wiring board is mounted on motherboard 94. It is preferred that first surface (F) of the printed wiring board be closer to the IC chip, and that second surface (S) be closer to the motherboard. Since IC chip 90 generates heat, the void may expand by the heat if it is positioned closer to the IC chip. If a void is set near the IC chip, the reliability of the through-hole conductor of the present embodiment may be lowered because of the heat generated by the IC chip.

Method for Manufacturing Printed Wiring Board of First Embodiment

FIG. 1 to FIG. 4 show a method for manufacturing buildup wiring board 10 of the first embodiment.

(1) Starting substrate 20 having a first surface and a second surface opposite the first surface is prepared. The starting substrate is preferred to be a double-sided copper-clad laminate. The double-sided copper-clad laminate is made up of insulative substrate (20z) having first surface (F) and second surface (S) opposite the first surface and copper foils 22 (22E1, 22E2) laminated on both of its surfaces (FIG. 1(A)). The starting substrate of the first embodiment is a double-sided copper-clad laminate. The thickness of copper foils (22, 22) is 2 µm. As for the double-sided copper-clad laminate, "ELC 4785TH-G," made by Sumitomo Bakelite Co., Ltd., may be used. Black-oxide treatment is conducted on surfaces of the copper foils 22. The thickness of the insulative substrate is preferred to be 150 µm to 400 µm. A void will be included in the through-hole conductor formed in a second opening portion.

The insulative substrate is made of resin and reinforcing material. Examples of reinforcing material are glass cloth, aramid fiber, fiberglass and the like. The glass is preferred to be T-glass. Examples of resin are epoxy resin, BT (bismaleimide triazine) resin and the like.

(2) A $CO_2$ laser is irradiated on first surface (F) of the starting substrate, and first opening portion (28F) is formed on the first-surface (F) side of the starting substrate to form a penetrating hole for a through-hole conductor (FIG. 1(B)). Here, the density, intensity, number of shots and the like of laser irradiation are adjusted so that first opening portion (28F) tapers from first surface (F) toward second surface (S). At the same time, the laser is adjusted so that length (e1) of eave (E1) is formed within the range of 0.1 µm to 10 µm.

(3) A $CO_2$ laser is irradiated on second surface (S) of the starting substrate, and second opening portion (28S) connected to first opening portion (28F) is formed. The laser is irradiated in such a way that the axis of the first opening portion corresponds to the axis of the second opening portion. Penetrating hole 28 for a through-hole conductor is formed (FIG. 1(C)). For example, the number of shots for forming a second opening portion is set greater than the number of shots for forming a first opening portion. Thus, the depth of the second opening portion is greater than the depth of the first opening portion. In addition, the diameter of first opening (28FO) is the same as that of second opening (28SO). The volume of second opening portion (28S) is greater than the volume of first opening portion (28F). The density, intensity, number of shots and the like of laser irradiation are adjusted so that second opening portion (28S) tapers from second surface (S) toward first surface (F). At the same time, the number of laser shots or laser output is adjusted so that length (e2) of eave (E2) is formed within the range of 1 µm to 10 µm.

FIG. 8(A) shows penetrating hole 28 for a through-hole conductor in FIG. 1(C). Thickness (t1) of insulative substrate (20z) is 200 µm. Depth (s1) of first opening portion (28F) is 80 µm, and depth (s2) of second opening portion (28S) is 120 µm. Diameter (d1) of first opening (28FO) of first opening portion (28F) is 100 µm, and diameter (d2) of second opening (28SO) of second opening portion (28S) is 100 µm. Diameter (d3) of the connecting plane is 60 µm. Diameter (d3) is the length of line (AB). Length (e1) of eave (E1) is 2 µm and length (e2) of eave (E2) is 4 µm.

(4) Electroless plating is performed to form electroless plated film 31 as a seed layer on surfaces of the starting material and on the inner wall of the penetrating hole (FIG. 1(D)). Thickness (f1) of electroless plated film 31 is approximately 0.3 µm. An enlarged view of FIG. 1(D) is shown in FIG. 8(B). Electroless plating covers the eaves.

(5) Plating resist 40 is formed on seed layer 31 (FIG. 1(E)).

(6) Electrolytic plating is performed to form electrolytic plated film 32 on the seed layer exposed from plating resist 40. Simultaneously, through-hole conductor 36 is formed in penetrating hole 28 (FIG. 1(F)). An enlarged view of FIG. 1(F) is shown in FIG. 9(A). Electrolytic plating may also be formed in penetrating hole 28 and on the seed layer without forming plating resist 40. In such a case, etching resist is formed on the electrolytic plated film, and conductive circuits are formed by removing portions of electrolytic plated film, seed layer and copper foil exposed from the etching resist.

Figure 9:
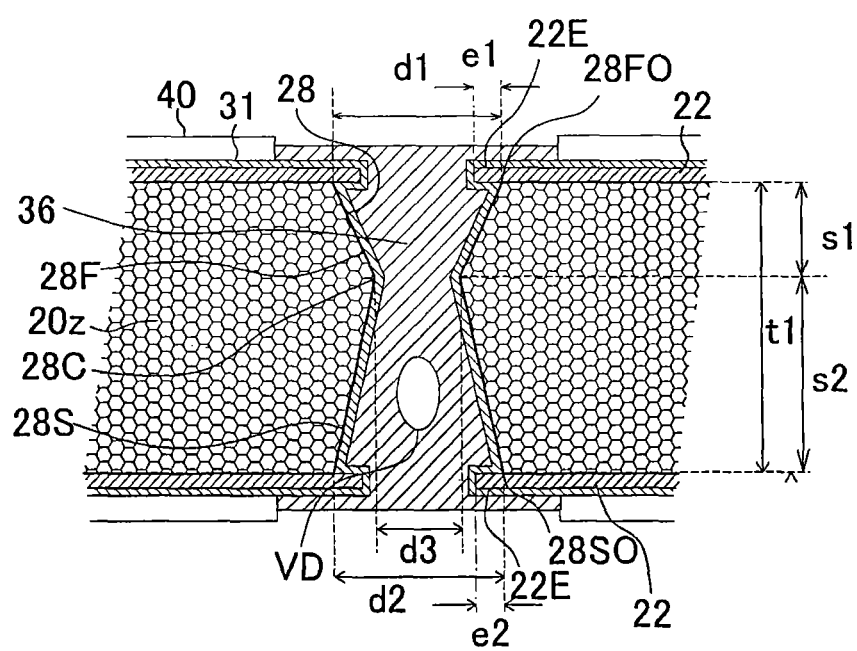
FIG. 9 shows a processing step in the method for manufacturing a printed wiring board according to the first embodiment.

When electrolytic plating is performed, a protruding portion made of an eave and the seed layer on the eave is present over each of the first opening and second opening (FIG. 8(B), FIG. 9). Thus, circulation of the plating solution is inhibited in penetrating hole 28. A void is formed in second opening portion (28S) which is deeper and has a greater volume. Since the first opening portion is shallower and has a smaller volume, the first opening portion is filled with plating. However, if the length of its eave exceeds 10 μm, a void tends to be formed as well in the first opening portion with a smaller volume.

(7) Plating resist 40 is removed, electroless plated film 31 and copper foil 22 between portions of electrolytic plated film 32 are removed, and printed wiring board 30 having a first conductive layer and a second conductive layer is completed (FIG. 2(A)). In the present application, a printed wiring board may also be referred to as a core substrate. Electrolytic plated film 31 and copper foil 22 are preferred to be removed by etching. Then, surfaces of conductive layers (34F, 34S) are roughened.

(8) Prepreg, containing glass cloth, inorganic particles of silica or the like and thermosetting resin such as epoxy, and metal foil (copper foil) 48 are laminated in that order on first surface (F) and second surface (S) of core substrate 30. The approximate thickness of metal foil is 2 μm. Next, hot pressing is conducted on the prepreg to form interlayer resin insulation layers (50F, 50S). Copper foil 48 is laminated on interlayer resin insulation layers (50F, 50S) (FIG. 2(B)). It is an option to use an interlayer resin insulation layer that does not contain reinforcing material but contains inorganic particles.

(9) Next, via conductor openings (51F, 51S) are respectively formed in interlayer resin insulation layers (50F, 50S) by irradiating a CO2 gas laser (FIG. 2(C)).

(10) Electroless plated films (52, 52) are formed on copper foils 48 and on the inner walls of openings (51F, 51S) (FIG. 2(D)). The thickness of electroless plated films (52, 52) is 0.5 μm.

(11) Plating resist 54 is formed on electroless plated films 52 (FIG. 3(A)).

(12) Electrolytic plating is performed to form electrolytic plated film 56 on the electroless plated films exposed from plating resist 54. At that time, openings (51F, 51S) are filled with electrolytic plated film 56. Via conductors (60F, 60S) are formed (FIG. 3(B)). Here, if a penetrating hole is made up of a first opening portion and a second opening portion having the same volume, or if a penetrating hole is made up of a first opening portion with a smaller volume and a second opening portion with a greater volume, such a penetrating hole can be filled with plating by decreasing the speed of depositing plating, but time for plating will increase. Thus, in the present embodiment, there is no void formed on the connecting plane of the first opening portion and the second opening portion. Even if a second opening portion with a greater volume has a void, defects are unlikely to occur in the through-hole conductor. High productivity is achieved.

(13) Plating resist 54 is removed. Metal foil 48 and electroless plated film 52 exposed from electrolytic plated film 56 are removed. Conductive layers (58F, 58S) are respectively formed on interlayer resin insulation layers (50F, 50S) (FIG. 3(C)). The thickness of conductive layers (58F, 58S) is 7 μm to 10 μm. Upper buildup layer (55F) and lower buildup layer (55S) are completed. Surfaces of conductive layers (58F, 58S) are roughened.

(14) Upper solder-resist layer (70F) having opening (71F) is formed on the upper buildup layer, and lower solder-resist layer (70S) having opening (71S) is formed on the lower buildup layer (FIG. 4(A)). The top surface of the conductive layer or via conductor exposed through opening (71F) of upper solder-resist layer (70F) works as C4 pad (71FP), and the top surface of the conductive layer or via conductor exposed through opening (71S) of lower solder-resist layer (70S) works as BGA pad (71SP).

(15) Nickel-plated layer 72 is formed on C4 pad (71FP) and BGA pad (71SP), and gold-plated layer 74 is further formed on nickel-plated layer 72 (FIG. 4(B)). Instead of nickel-gold layers, nickel-palladium-gold layers or an OSP film may also be formed.

(16) A solder ball is loaded on C4 pad (71FP), and a solder ball is loaded on BGA pad (71SP).

(17) By conducting a reflow process, C4 bump (76F) is formed on C4 pad (71FP), and BGA bump (76S) is formed on BGA pad (71SP). Buildup wiring board 10 is completed (FIG. 5).

Second Embodiment

Figure 11:
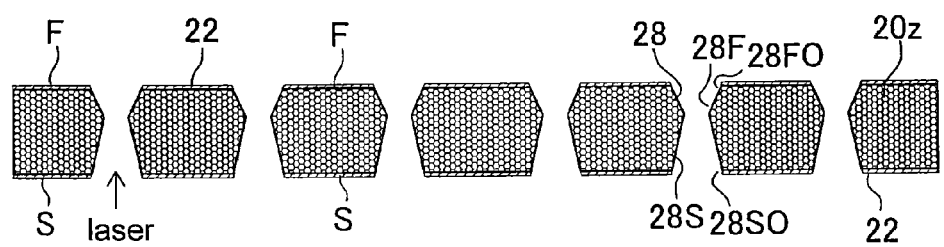
FIGS. 11(A)-(B) show views of processing steps in a method for manufacturing a printed wiring board according to a second embodiment.
Figure 11:
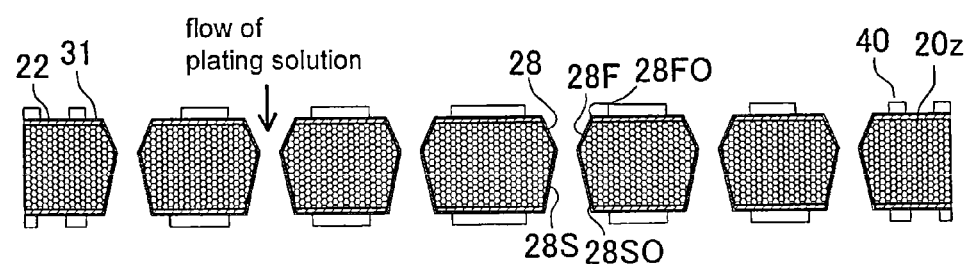

FIG. 11 shows a method for manufacturing a buildup wiring board according to a second embodiment.

A penetrating hole is formed in a double-sided copper-clad laminate, the same as in the first embodiment (FIG. 1(C)). Next, eaves (E1, E2) over the first and second openings are etched away (FIG. 11(A)). Alternatively, after the first opening portion is formed, eave (E1) over the first opening is etched away, and then a second opening portion may be formed. In such a case, no eave is formed over the first opening, and an eave is formed over the second opening. It is easier to fill the first opening portion with plated film, and the plated film in the second opening portion is more likely to include a void.

The same as in the first embodiment, electroless plating is performed to form electroless plated film 31 on surfaces of the starting material and on the inner wall of the penetrating hole. Then, plating resist 40 is formed on electroless plated film 31 (FIG. 11(B)).

When electrolytic plating is performed, the electrolytic plating solution is supplied into the penetrating hole from the first opening portion (28F) side (FIG. 11(B)). Thus, first opening portion (28F) is filled with electrolytic plated film 32, and void (VD) is formed in electrolytic plated film 32 in second opening portion (28S).

The amount of the plating solution supplied from the first opening portion side into the penetrating hole may be set greater than the amount of the plating solution supplied from the second opening portion side into the penetrating hole. A void is more likely to be formed in the second opening portion.

Then, the same method as in the first embodiment may be employed in subsequent steps to manufacture a printed wiring board and a buildup wiring board.

Third Embodiment

Figure 12:
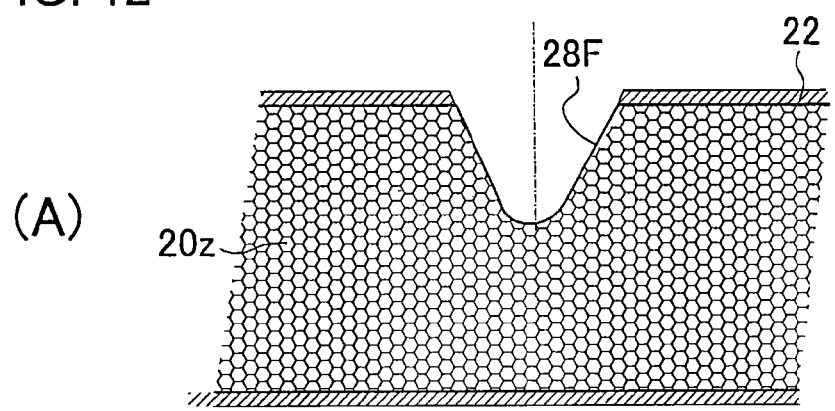
FIGS. 12(A)-(B) show views of processing steps in a method for manufacturing a printed wiring board according to a third embodiment.
Figure 12:
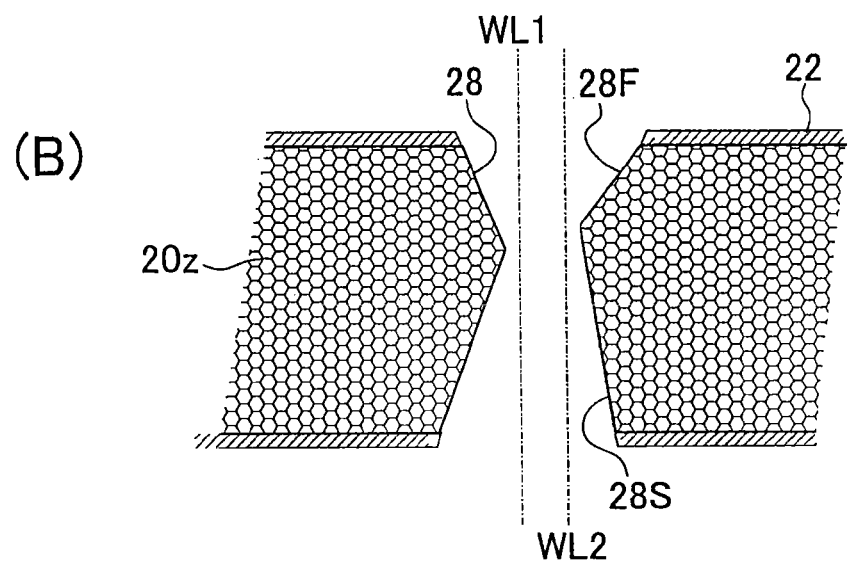

FIG. 12 shows a method for manufacturing a printed wiring board according to a third embodiment.

A first opening portion is formed in a double-sided copper-clad laminate the same as in the first embodiment (FIG. 12(A)). Then, a second opening portion is formed in the double-sided copper-clad laminate in such a way that axis (WL2) of a second opening portion does not correspond to axis (WL1) of the first opening portion (FIG. 12(B)). For example, axis positions are adjustable by setting the irradiation positions on a laser processing machine. A penetrating hole shown in FIG. 10 is formed.

Then, the same method as in the first embodiment is employed in subsequent steps to manufacture a printed wiring board and a buildup wiring board.

When two blind holes of a penetrating hole have similar shapes, similar depths and similar volumes, resistance increases in a through-hole conductor having a void. Thus, when an IC chip is mounted on the printed wiring board, a stable supply of power is hard to be provided to the IC chip. It is thought that the void expands when heat is generated, thus causing damage to the through-hole conductor.

Also, even if the shape of a penetrating hole is in the form of an hourglass shape, it may be difficult to completely fill the penetrating hole with plating. Especially, when the thickness of the insulative substrate is 150 μm or greater, it is difficult to completely fill the penetrating hole with plating.

In addition, if the through-hole conductor formed in one blind hole has a void, the volume of the plated film deposited in that blind hole is smaller than the volume of the plated film deposited in the other blind hole. At the same time that plated film is filled in the penetrating hole, the plated film is also formed on the insulative substrate. During that time, since the volume of the plated film formed in one blind hole is smaller than the volume of the plated film formed in the other blind hole, the thickness of the plated film formed on one surface of the insulative substrate is greater than the thickness of the plated film formed on the other surface of the insulative substrate. Since the thickness of the conductive layer on one surface of the insulative substrate is greater, it is hard to form fine conductive circuits on that surface. Also, since the thicknesses of conductive circuits differ on the upper and lower surfaces of the insulative substrate, the degree of warping of the printed wiring board is greater. Here, the insulative substrate has one surface and the other surface opposite the one surface, and one blind hole is formed on one surface side and the other blind hole is formed on the other surface side.

When two blind holes forming the penetrating hole have similar shapes, the reliability of the through-hole conductor is thought to be low.

A printed wiring board according to an embodiment of the present invention enhances the reliability of through-hole conductors. A printed wiring board according to an embodiment of the present invention has hourglass-shaped through-hole conductors and fine conductive circuits. A printed wiring board according to an embodiment of the present invention has a smaller degree of warping.

A printed wiring board according to an embodiment of the present invention has an insulative substrate that has a first surface and a second surface opposite the first surface and a penetrating hole made up of a first opening portion formed on the first-surface side and a second opening portion formed on the second-surface side, a first conductive layer formed on the first surface of the insulative substrate, a second conductive layer formed on the second surface of the insulative substrate, and a through-hole conductor formed in the penetrating hole and connecting the first conductive layer and the second conductive layer. The depth of the second opening portion is greater than the depth of the first opening portion, the volume of the second opening portion is greater than the volume of the first opening portion, and the through-hole conductor formed in the second opening portion includes a void.

A method for manufacturing a printed wiring board according to another embodiment of the present invention includes the following: preparing a starting substrate having an insulative substrate with a first surface and a second surface opposite the first surface; by irradiating a laser on the first surface of the insulative substrate, forming a first opening portion on the first-surface side of the insulative substrate; by irradiating a laser on the second surface of the insulative substrate, forming a second opening portion on the second-surface side of the insulative substrate to be connected to the first opening portion so that a penetrating hole for a through-hole conductor is formed in the insulative substrate; forming a seed layer in the penetrating hole and on the first surface and the second surface of the insulative substrate; and forming a through-hole conductor in the penetrating hole by forming electrolytic plated film on the seed layer. When forming the second opening portion, the volume of the second opening portion is made greater than the volume of the first opening portion, and the through-hole conductor formed in the second opening portion includes a void.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an insulative substrate having a penetrating hole;
   a first conductive layer formed on a first surface of the insulative substrate;
   a second conductive layer formed on a second surface of the insulative substrate; and
   a through-hole conductor formed in the penetrating hole through the insulative substrate such that the through-hole conductor is connecting the first conductive layer and the second conductive layer,
   wherein the penetrating hole has a first opening portion formed on a first-surface side of the insulative substrate and a second opening portion formed on a second-surface side of the insulative substrate such that the second opening portion has a depth which is greater than a depth of the first opening portion and the second opening portion has a volume which is greater than a volume of the first opening portion, and the through-hole conductor formed in the second opening portion includes a void portion.

2. A printed wiring board according to claim 1, wherein the first opening portion has a first opening formed on the first surface of the insulative substrate and the second opening portion has a second opening formed on the second surface of the insulative substrate such that the second opening has a diameter which is greater than a diameter of the first opening.

3. A printed wiring board according to claim 2, further comprising:
   a metal foil laminated on the second surface of the insulative substrate, wherein the penetrating hole includes an opening penetrating through the metal foil such that the opening of the metal foil has a diameter which is smaller than a diameter of the second opening of the second opening portion.

4. A printed wiring board according to claim 3, wherein the penetrating hole has a connecting plane connecting the first opening portion and the second opening portion such that the connecting plane is inclined with respect to the first surface of the insulative substrate.

5. A printed wiring board according to claim 2, further comprising:
   a first metal foil laminated on the first surface of the insulative substrate; and
   a second metal foil laminated on the second surface of the insulative substrate, wherein the penetrating hole includes an opening penetrating through the first metal foil and an opening penetrating through the second metal foil such that the opening of the first metal foil has a diameter which is smaller than a diameter of the first opening of the first opening portion and the opening of the second metal foil has a diameter which is smaller than a diameter of the second opening of the second opening portion.

6. A printed wiring board according to claim 2, further comprising:
a metal foil laminated on the second surface of the insulative substrate and having an opening connected to the second opening of the second opening portion such that the metal foil is partially covering the second opening of the second opening portion.

7. A printed wiring board according to claim 2, further comprising:
a first metal foil laminated on the first surface of the insulative substrate and having an opening connected to the first opening of the first opening portion such that the first metal foil is partially covering the first opening of the first opening portion; and
a second metal foil laminated on the second surface of the insulative substrate and having an opening connected to the second opening of the second opening portion such that the second metal foil is partially covering the second opening of the second opening portion.

8. A printed wiring board according to claim 2, further comprising:
a metal foil laminated on the second surface of the insulative substrate and having an opening connected to the second opening of the second opening portion an eave portion extending over the second opening of the second opening portion such that the eave portion of the metal foil has a length in a range of 1 µm to 10 µm.

9. A printed wiring board according to claim 2, wherein the penetrating hole has a connecting plane connecting the first opening portion and the second opening portion such that the connecting plane is inclined with respect to the first surface of the insulative substrate.

10. A printed wiring board according to claim 1, wherein the penetrating hole has a connecting plane connecting the first opening portion and the second opening portion, and the through-hole conductor has no void portion formed at the connecting plane.

11. A printed wiring board according to claim 1, wherein the through-hole formed in the first opening portion does not include a void portion.

12. A printed wiring board according to claim 1, wherein the penetrating hole has a connecting plane connecting the first opening portion and the second opening portion such that the connecting plane is inclined with respect to the first surface of the insulative substrate.

13. A printed wiring board according to claim 1, wherein the first opening portion has an axis which is set off from an axis of the second opening portion.

14. A printed wiring board according to claim 1, wherein the penetrating hole has a connecting plane connecting the first opening portion and the second opening portion, and the first opening portion has an axis which is set off from an axis of the second opening portion such that the connecting plane is inclined with respect to the first surface of the insulative substrate.

15. A printed wiring board according to claim 1, wherein the first opening portion has a first opening formed on the first surface of the insulative substrate such that the first opening portion has an axis passing through a gravity center of the first opening, and the second opening portion has a second opening formed on the second surface of the insulative substrate such that the second opening portion has an axis passing through a gravity center of the second opening.

16. A method for manufacturing a printed wiring board, comprising:
irradiating laser on a first surface of an insulative substrate such that a first opening portion is formed on a first-surface side of the insulative substrate;
irradiating laser on a second surface of the insulative substrate such that a second opening portion connected to the first opening portion is formed on a second-surface side of the insulative substrate and a penetrating hole for a through-hole conductor is formed through the insulative substrate;
forming a seed layer in the penetrating hole and on the first surface and the second surface of the insulative substrate; and
filling an electrolytic plated material into a space formed by the seed layer in the penetrating hole of the insulative substrate such that a through-hole conductor comprising the electrolytic plated material is formed in the penetrating hole,
wherein the second opening portion is formed such that the second opening portion has a volume which is greater than a volume of the first opening portion, and the through-hole conductor is formed such that the through-hole conductor formed in the second opening portion includes a void portion.

17. A method for manufacturing a printed wiring board according to claim 16, wherein the filling of the electrolytic plated material includes controlling electrolytic plating of the space formed by the seed layer in the penetrating hole of the insulative substrate such that a flow rate of the electrolytic plated material into the space from the first-surface side of the insulative substrate is made greater than a flow rate of the electrolytic plated material into the space from the second-surface side of the insulative substrate.

18. A method for manufacturing a printed wiring board according to claim 16, wherein the second opening portion is formed such that the second opening portion has a depth which is greater than a depth of the first opening portion.

19. A method for manufacturing a printed wiring board according to claim 16, wherein the insulative substrate has a metal foil laminated on the second surface of the insulative substrate, and the irradiating laser on the second surface of the insulative substrate includes irradiating on the metal foil such that an opening connected to the second opening of the second opening portion is formed through the metal foil such that the metal foil is partially covering the second opening of the second opening portion.

20. A method for manufacturing a printed wiring board according to claim 16, wherein the second opening portion is formed such that the penetrating hole has a connecting plane connecting the first opening portion and the second opening portion and inclined with respect to the first surface of the insulative substrate.

* * * * *